(12) United States Patent
Wesolowski

(10) Patent No.: US 6,259,328 B1
(45) Date of Patent: Jul. 10, 2001

(54) METHOD AND SYSTEM FOR MANAGING REFERENCE SIGNALS FOR NETWORK CLOCK SYNCHRONIZATION

(75) Inventor: Jan Wesolowski, Redwood City, CA (US)

(73) Assignee: Network Equipment Technologies, Inc., Fremont, CA (US)

( * ) Notice: Subject to any disclaimer, the term of this patent is extended or adjusted under 35 U.S.C. 154(b) by 0 days.

(21) Appl. No.: 09/466,352

(22) Filed: Dec. 17, 1999

(51) Int. Cl.[7] .............................. H03L 7/08; H03L 7/18; H03L 7/197

(52) U.S. Cl. .............................. 331/14; 331/17; 331/18; 331/25; 331/49; 327/147; 327/292

(58) Field of Search ................................ 331/10, 14, 17, 331/18, 25, 49; 327/147, 292

(56) References Cited

U.S. PATENT DOCUMENTS

| | | | |
|---|---|---|---|
| 5,161,175 | * 11/1992 | Parker et al. | 331/1 A |
| 5,260,979 | * 11/1993 | Parker et al. | 331/17 |
| 5,457,428 | * 10/1995 | Alder et al. | 331/1 A |

* cited by examiner

Primary Examiner—Siegfried H. Grimm
(74) Attorney, Agent, or Firm—Crosby, Heafey, Roach & May

(57) ABSTRACT

Methods and systems are disclosed for eliminating a phase transient of a controlled frequency oscillator caused by replacing a first reference signal by a second reference signal when the first reference signal becomes corrupted or otherwise unavailable, and for running a controlled frequency oscillator in a frequency-controlled holdover mode. The contradictory requirements of using a relatively low-cost controlled frequency oscillator tunable over a relatively wide frequency range and achieving high stability of its frequency in holdover mode are satisfied.

22 Claims, 7 Drawing Sheets

METHOD AND SYSTEM FOR MANAGING REFERENCE SIGNALS FOR NETWORK CLOCK SYNCHRONIZATION

BACKGROUND

1. Field of the Invention

The present invention relates generally to the field of time division multiplexing, and specifically to the field of switching in computer networks.

2. Description of the Background Art

In the available art related to time division multiplexing and network switching, network operations are done synchronously to minimize errors. Digital switching equipment included in the networks needs to be synchronized to a single network clocking or synchronization source even if such synchronization is not required for the switching equipment's internal operations. The common system clock source is normally phase-locked to a synchronization reference signal within the network using a commonly understood phase-locked loop.

The synchronization reference signals are usually originated by a Primary Reference Source (PRS) of the network, or derived therefrom. The synchronization reference signals often take the form of regular data carrying network signals. Since such signals usually carry the data streams grouped in blocks or frames, they have to contain information about the block or frame boundaries. It is the timing of the framing information that is used as the reference for network synchronization. The typical rate of such a reference signal is 8 kHz. The system clock is usually generated by a controlled frequency oscillator running at an average frequency, the frequency being a predetermined multiple of the reference signal rate. The frequency of the oscillator is controlled by a phase-locked loop, which is required to maintain a constant timing relationship between the phase of the system clock and a long-time average phase of the synchronization reference signal.

An available system clock oscillator is implemented by using a voltage controlled oscillator (VCO), which changes its frequency in response to changes in voltage. To facilitate measurement of the current timing (phase) relationship between the system clock and the synchronization reference signal, the system clock needs to be brought to the common form of all references. This is typically done by dividing the frequency of the system clock by a fixed frequency divider.

The phase-locked loop uses a phase difference detector to measure the current timing (phase) relationship between the synchronization reference and the feedback signal derived from the system clock. From the measured phase difference, a specially chosen filter produces a signal controlling the system clock oscillator in a manner making the long-term average of the measured phase difference a constant value. The quantity of this average phase difference is typically irrelevant as long as it is constant. It is characteristic of the particular phase-locked loop design.

Available network synchronization phase-locked loops are often required to maintain only a very long-term (average) phase relationship between the reference and feedback signals. Short-term changes are ignored in order to minimize transfer of wander and jitter from the reference signal to the system clock. This is accomplished by designing, typically, a second order phase-locked loop with a transfer function bandwidth on the order of 0.1 Hz or less. An analog filter needed for such a loop would require using components having large values and size, which would make the system clock phase highly dependent on the system temperature. Therefore, such a phase-locked loop filter is typically implemented in the digital domain. Since such a filter operates at a relatively low frequency, it is feasible to implement its function as one of the procedures of an embedded real-time program executed by a microcontroller or similar integrated circuit. In particular, the same microcontroller that performs general Function Control may also be used for network synchronization.

The parameters of the filter can be controlled by the Function Control block in order to shorten the phase-lock acquisition time by temporarily widening the loop bandwidth. In a general case, the synchronization reference signals may differ among themselves in phase and/or frequency. Since the phase-locked loop is required to always bring the long-term average reference-to-feedback phase difference to a constant value, selecting a new reference, even one with an identical frequency, but a substantially different phase, results in a transition, forcing the system clock oscillator to an undesired frequency and causing a drift of the feedback signal with respect to the reference until their relative phase is brought back to the constant value.

From time to time, all of the external reference signals may be temporarily and simultaneously unsuitable for network synchronization purposes, but it may be desirable to continue running the system clock with the frequency and phase acquired before the simultaneous dysfunction occurred. In such case, the network synchronization card typically freezes the value controlling the system clock oscillator at the previously acquired level, allowing it to run free and assuming that its stability guarantees the continuation of the frequency and phase for time intervals that may be as long as 24 hours. This mode of operation of the network synchronization card is commonly referred to as a holdover mode.

In one available network synchronization card design, the mid-range frequency of such a voltage controlled oscillator is 19.44 MHz, i.e. it is 2430 times the typical 8 kHz reference frequency. The tuning range of the oscillator, relative to its center frequency, is typically on the order of +/−30 parts per million (PPM). The commonly required stability of the oscillator in the holdover mode is +/−4.6 PPM.

The requirement of high stability in holdover mode(+/−4.6 PPM) is difficult to satisfy by a controlled-frequency oscillator which, at the same time, is also required to be tuned over a relatively wide frequency range (+/−30 PPM). Oscillators that satisfy both requirements are expensive. There is therefore a need in the art for an efficient solution to this challenge.

SUMMARY OF THE INVENTION

To address the shortcomings of the available art, the present invention provides a method and a system (i) for eliminating a phase transient of a controlled-frequency oscillator caused by replacing a first reference signal by a second reference signal when the first reference signal becomes corrupted or otherwise unavailable, and (ii) for running an controlled-frequency oscillator in a controlled long term holdover mode.

The present invention utilizes phase-locked loop ("PLL") circuitry including a relatively inexpensive oscillator that can be tuned over a relatively wide frequency range, wherein the requirement of high stability in holdover mode is satisfied by running the controlled-frequency oscillator in phase-lock with a signal derived from a stable, fixed-frequency (hence, relatively inexpensive) local oscillator, while any phase transient is eliminated and the previously acquired phase and frequency are preserved by precisely controlling the frequency division ratio of a tunable-frequency processing device.

A first advantage of the present invention therefore is the provision of a method for eliminating a phase transient of a controlled-frequency oscillator caused by replacing a first reference signal having a first reference phase and a first reference frequency by a second reference signal having a second reference phase and a second reference frequency when the first reference signal becomes corrupted or otherwise unavailable.

A second advantage is the provision of a method for eliminating a phase transient of a controlled-frequency oscillator utilizing a phase-locked loop (PLL), the method comprising the steps of (a) acquiring a first phase lock with a first reference signal having a first reference phase and a first reference frequency while using in the PLL a feedback signal having a feedback phase and a feedback frequency, the feedback signal being generated by a tunable frequency processing device operating with a constant, nominal frequency division ratio, the tunable frequency processing device being clocked by a clock signal generated by the controlled-frequency oscillator, the feedback frequency of the feedback signal being derived by dividing a frequency of the clock signal by the constant, nominal frequency division ratio of the tunable frequency processing device, the first phase lock resulting in a substantially constant first phase difference between the first reference phase and the feedback phase, and in a substantially constant first value of a control signal derived from the substantially constant first phase difference, (b) storing the first value of the control signal and using the first stored control value as a signal controlling the frequency of the controlled-frequency oscillator, resulting in the controlled-frequency oscillator running at a constant frequency derived from the first stored value of the control signal, (c) selecting a second reference signal having a second frequency and a second phase, while continuing the control of the controlled-frequency oscillator with the first stored control value which results in the controlled-frequency oscillator running at the constant frequency derived from the first stored control value; (d) detecting a second phase difference between the second reference signal and the feedback signal; using the second phase difference to derive a signal for controlling the feedback frequency division ratio of the tunable frequency processing device, resulting in controlling the frequency and the phase of the feedback signal generated by the tunable frequency processing device in such a way that a second phase lock of the feedback signal with the second reference signal is acquired, wherein the frequency of the locked feedback signal is substantially equal to the frequency of the second reference signal, and the second phase difference is substantially equal to the first phase difference; and (e) setting the feedback frequency division ratio back to the nominal constant value; switching a frequency control of the controlled-frequency oscillator from the first stored control value to a signal derived from the second phase difference between the phase of the second reference signal and the phase of the feedback signal; and acquiring a third phase lock of the feedback signal to the second reference signal by controlling the frequency of the controlled-frequency oscillator, the third phase lock resulting in a substantially constant the second phase difference between the first reference phase and the feedback phase.

Still another advantage of the present invention is the provision of a method for running a controlled-frequency oscillator in a frequency-controlled holdover mode comprising the steps of (a) storing a pre-holdover mode value of the signal controlling the controlled-frequency oscillator, and applying the stored pre-holdover value to the controlled-frequency oscillator, resulting in the controlled-frequency oscillator running at a constant pre-holdover mode frequency and a pre-holdover mode phase derived from the stored pre-holdover value of the control signal, (b) selecting a local reference signal, having a local reference frequency and a local reference phase, as a PLL reference in holdover mode; detecting a holdover phase difference between the local reference signal and a feedback signal generated by a tunable frequency processing device; the tunable feedback frequency processing device being clocked by the controlled-frequency oscillator, (c) using the holdover phase difference to derive a signal for controlling a variable frequency division ratio of the tunable feedback frequency processing device, resulting in controlling a frequency and a phase of the feedback signal in such a way that a first holdover phase lock of the feedback signal with the local reference signal is acquired, wherein the frequency and the phase of the locked feedback signal are substantially equal to the frequency and the phase of the local reference signal, (d) storing a holdover value of the signal controlling the tunable feedback frequency processing device, the holdover value of the controlling signal obtained as a result of the first holdover phase lock acquired in step (c), and applying the stored holdover value to the tunable feedback frequency processing device, resulting in the tunable feedback frequency processing device running with a constant, non-nominal frequency division ratio, (e) using the holdover phase difference to control frequency of the controlled-frequency oscillator in such a way that a second holdover phase lock of the feedback signal with the local reference signal is acquired, and (f) continuing in the second holdover phase lock state acquired in the step (e) for the required duration of the holdover mode, wherein the controlled-frequency oscillator continues to generate the system clock signal having the pre-holdover mode phase and the pre-holdover mode frequency.

Another advantage of the present invention is the provision of a method for switching a network synchronization card from a normal mode of operation to a holdover mode of operation using a phase-locked loop (PLL), the method comprising the steps of (a) storing a control value of a signal controlling an controlled-frequency oscillator at the level acquired as a result of phase lock during the normal mode of operation of the network synchronization card; applying the stored control value to the controlled-frequency oscillator, resulting in the controlled-frequency oscillator running at a constant normal mode frequency and a constant normal mode phase derived from the stored normal value of the control signal, (b) selecting a local reference signal, having a local reference frequency and a local reference phase, as a PLL reference in holdover mode; detecting a holdover phase difference between the local reference signal and a feedback signal generated by a tunable frequency processing device; the tunable feedback frequency processing device being clocked by the controlled-frequency oscillator, (c) using the holdover phase difference to derive a signal for controlling a variable frequency division ratio of the tunable feedback frequency processing device, resulting in controlling a frequency and a phase of the feedback signal in such a way that a first holdover phase lock of the feedback signal with the local reference signal is acquired, wherein the frequency and the phase of the locked feedback signal are substantially equal to the frequency and the phase of the local reference signal, (d) storing a holdover value of the signal controlling the tunable feedback frequency processing device, the holdover value of the controlling signal obtained as a result of the first holdover phase lock acquired in step (c), and applying the stored holdover value to the tunable feedback frequency processing device, resulting in the tunable feedback frequency processing device running with a constant, non-nominal frequency division ratio, and (e) using the holdover phase difference to control frequency of the controlled-frequency oscillator in such a way that a second holdover phase lock of the feedback signal with the local reference signal is acquired.

Yet another advantage of the present invention is the provision of a system for eliminating a phase transient of a controlled-frequency oscillator utilizing a phase-locked loop (PLL) comprising (a) means for acquiring a first phase lock with a first reference signal having a first reference phase and a first reference frequency while using in the PLL a feedback signal having a feedback phase and a feedback frequency, the first phase lock resulting in a substantially constant first phase difference between the first reference phase and the feedback phase, and in a substantially constant first value of a control signal derived from the substantially constant first phase difference, (b) means for storing the first value of the control signal and using the stored first controlled value as a signal controlling the frequency of the controlled-frequency oscillator, resulting in the controlled-frequency oscillator running at a constant frequency derived from the first stored value of the control signal, (c) a tunable frequency processing device operating with a controllable frequency division ratio, the tunable frequency processing device being clocked by a clock signal generated by the controlled-frequency oscillator, the tunable frequency processing device configured to generate the feedback signal, the feedback frequency of the feedback signal being derived by dividing a frequency of the clock signal by the controllable frequency division ratio of the tunable frequency processing device, (d) means for selecting a second reference signal having a second reference frequency and a second reference phase, while continuing the control of the controlled-frequency oscillator with the stored first control value which results in the controlled-frequency oscillator running at the constant frequency derived from the first stored control value, (e) means for detecting a second phase difference between the second reference signal and the feedback signal; using the second phase difference to derive a signal for controlling the controllable feedback frequency division ratio of the tunable frequency processing device, resulting in controlling the frequency and the phase of the feedback signal generated by the tunable frequency processing device in such a way that a second phase lock of the feedback signal with the second reference signal is acquired, wherein the frequency and the phase of the locked feedback signal are substantially equal to the frequency and the phase of the second reference signal, (f) means for setting the feedback frequency division ratio back to the nominal constant value, and (g) means for switching a frequency control of the controlled-frequency oscillator from the first stored control value to a signal derived from the second phase difference between the phase of the second reference signal and the phase of the feedback signal, the second phase difference being substantially equal to the first phase difference, wherein a third phase lock of the feedback signal to the second reference signal is acquired by controlling the frequency of the controlled-frequency oscillator.

Yet another advantage of the present invention is the provision of a method for switching a network synchronization card from a normal mode of operation to a holdover mode of operation using a phase-locked loop (PLL), the method comprising the steps of (a) storing a control value of a signal controlling an controlled-frequency oscillator at the level acquired as a result of phase lock during the normal mode of operation of the network synchronization card; applying the stored control value to the controlled-frequency oscillator, resulting in the controlled-frequency oscillator running at a constant normal mode frequency and a constant normal mode phase derived from the stored normal value of the control signal, (b) selecting a local reference signal, having a local reference frequency and a local reference phase, as a PLL reference in holdover mode; detecting a holdover phase difference between the local reference signal and a feedback signal generated by a tunable frequency processing device; the tunable feedback frequency processing device being clocked by the controlled-frequency oscillator, (c) using the holdover phase difference to derive a signal for controlling a variable frequency division ratio of the tunable feedback frequency processing device, resulting in controlling a frequency and a phase of the feedback signal in such a way that a first holdover phase lock of the feedback signal with the local reference signal is acquired, wherein the frequency and the phase of the locked feedback signal are substantially equal to the frequency and the phase of the local reference signal, (d) storing a holdover value of the signal controlling the tunable feedback frequency processing device, the holdover value of the controlling signal obtained as a result of the first holdover phase lock acquired in step (c), and applying the stored holdover value to the tunable feedback frequency processing device, resulting in the tunable feedback frequency processing device running with a constant, non-nominal frequency division ratio, and (e) using the holdover phase difference to control frequency of the controlled-frequency oscillator in such a way that a second holdover phase lock of the feedback signal with the local reference signal is acquired.

Still another advantage of the present invention is the provision of a system for eliminating a phase transient of a controlled-frequency oscillator utilizing a phase-locked loop (PLL) comprising (a) means for acquiring a first phase lock with a first reference signal having a first reference phase and a first reference frequency while using in the PLL a feedback signal having a feedback phase and a feedback frequency, the first phase lock resulting in a substantially constant first phase difference between the first reference phase and the feedback phase, and in a substantially constant first value of a control signal derived from the substantially constant first phase difference, (b) means for storing the first value of the control signal and using the stored first controlled value as a signal controlling the frequency of the controlled-frequency oscillator, resulting in the controlled-frequency oscillator running at a constant frequency derived from the first stored value of the control signal, (c) a tunable frequency processing device operating with a controllable frequency division ratio, the tunable frequency processing device being clocked by a clock signal generated by the controlled-frequency oscillator, the tunable frequency processing device configured to generate the feedback signal, the feedback frequency of the feedback signal being derived by dividing a frequency of the clock signal by the controllable frequency division ratio of the tunable frequency processing device, (d) means for selecting a second reference signal having a second reference frequency and a second reference phase, while continuing the control of the controlled-frequency oscillator with the stored first control value which results in the controlled-frequency oscillator running at the constant frequency derived from the first stored control value, (e) means for detecting a second phase difference between the second reference signal and the feedback signal; using the second phase difference to derive a signal for controlling the controllable feedback frequency division ratio of the tunable frequency processing device, resulting in controlling the frequency and the phase of the feedback signal generated by the tunable frequency processing device in such a way that a second phase lock of the feedback signal with the second reference signal is acquired, wherein the frequency and the phase of the locked feedback signal are substantially equal to the frequency and the phase of the second reference signal, (f) means for setting the feedback frequency division ratio back to the nominal constant value, and (g) means for switching a frequency control of the controlled-frequency oscillator from the first stored control value to a signal derived from the second phase difference between the phase of the second reference signal and the phase of the feedback signal, the second phase difference being substantially equal to the first phase difference, wherein a third phase lock of the feedback signal to the second reference signal is acquired by controlling the frequency of the controlled-frequency oscillator.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS

Figure 1:
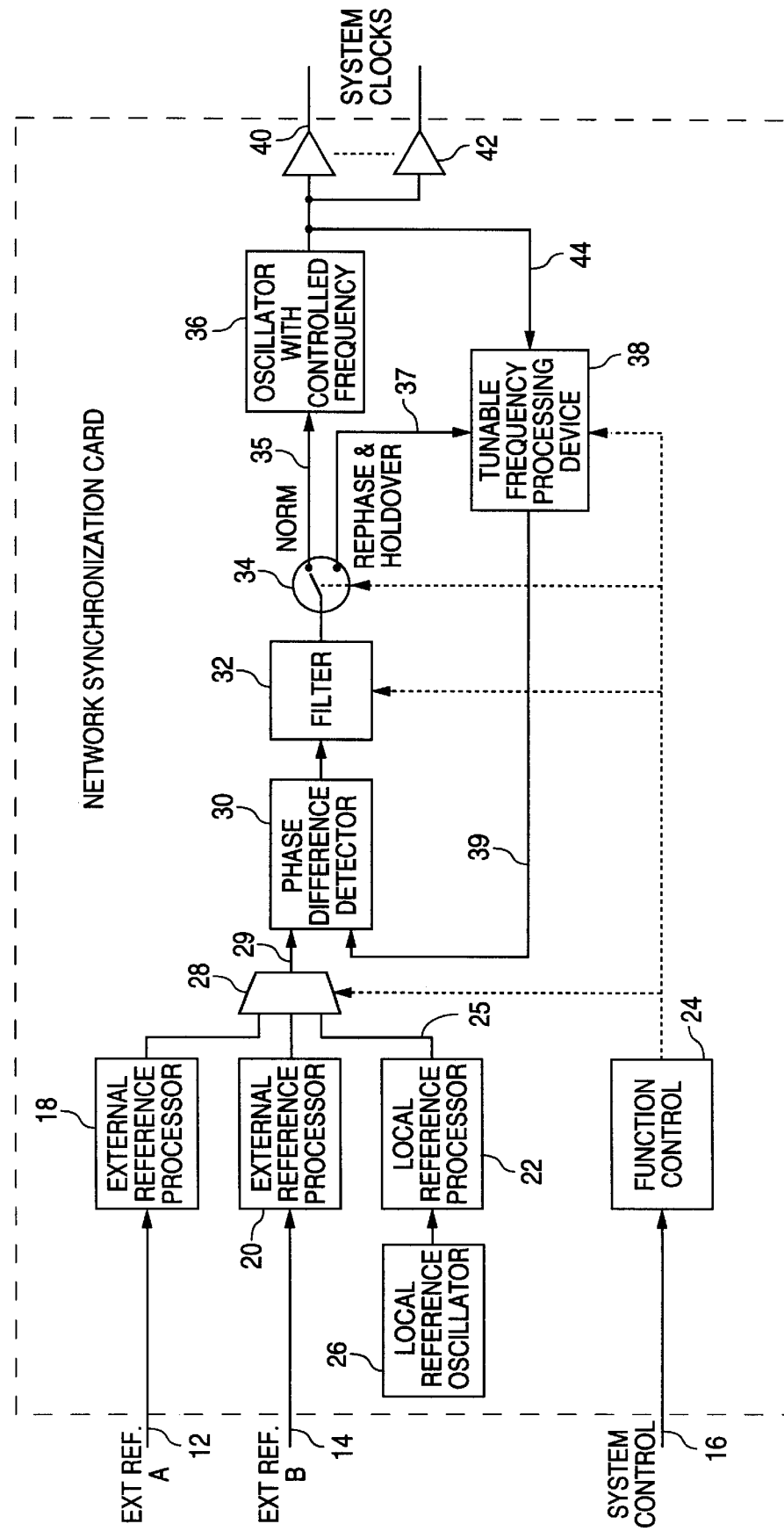
FIG. 1 depicts a network synchronization card of the present invention.

The present invention can be best understood by focusing on the network synchronization card circuitry (10) as depicted in FIG. 1. In the preferred embodiment displayed, a system clock of network synchronization card 10 comprises a controlled-frequency oscillator 36. In one embodiment, the present invention utilizes the network synchronization card 10 to eliminate a phase transient of oscillator 36 caused by selecting a new, available and suitable external reference signal 14 whenever the prior selected external reference signal 12 becomes corrupted or otherwise unavailable.

In general, because the switching of the network synchronization card 10 from the existing external reference signal 12 to the newly selected reference signal 14 happens at an arbitrary instance in time, the phase of the newly selected reference signal 14 in all likelihood differs substantially from the phase of prior reference signal 12.

In another embodiment of the present invention, if no suitable external reference is available at all, the network synchronization card 10 is utilized to switch controlled-frequency oscillator 36 into a frequency-controlled holdover mode and to keep the controlled-frequency oscillator running in the holdover mode until a suitable external reference becomes available again.

In yet another embodiment of the present invention, the network synchronization card 10 switches controlled-frequency oscillator 36 from an external reference mode to a holdover mode, or from a holdover mode into an external reference mode.

The network synchronization card 10 receives multiple external synchronization reference signals (12, 14) provided for redundancy and reliability purposes. In addition to the external references, there is also a reference signal generated locally, preferably by a fixed-frequency, high-stability reference oscillator 26. Before being used, each of the reference signals is processed by an external reference processor (18, 20), or by a local reference processor 22 correspondingly, in order to extract the relevant timing (framing) information and to bring all the references to a common form. Thereafter, one of the references is selected to become the active reference signal.

The typical rate of such a common form reference signal, whether an external one, or a local one, is 8 kHz. The controlled-frequency oscillator 36, or a system clock, generates a clock signal (40, 42, or 44) having an average frequency being equal to a predetermined multiple of the reference signal frequency.

Referring still to FIG. 1, the frequency of controlled-frequency oscillator 36 is controlled by a PLL comprising a phase difference detector 30, a filter 32, a switcher 34, and a tunable frequency processing device 38 having a controllable division ratio. The PLL maintains a constant timing relationship between the phase of controlled-frequency oscillator 36 and a long-time average phase of the synchronization reference—that is, only a very long-term phase relationship of the reference and feedback signals is maintained, while short-term changes are ignored.

To facilitate measurements of the current timing (phase) relationship between controlled-frequency oscillator 36 and the synchronization reference signal, the output signal of controlled-frequency oscillator 36 needs to be brought to the same common form as the references. In one embodiment of the present invention, the output signal of controlled-frequency oscillator 36 is brought to the common form by dividing the frequency of controlled-frequency oscillator 36 by the controllable division ratio of the tunable frequency processing device 38.

As depicted in FIG. 1, the PLL uses the phase difference detector 30 to measure the current timing (phase) relationship between the synchronization reference 29 and the feedback signal 39 generated by tunable frequency processing device 38. The function of PLL filter 32 may be implemented as one of the procedures of an embedded real-time program executed by a microcontroller. In particular, it may be the same controller that performs control functions. The parameters of the filter 32 can be controlled by Function Control block 24 in order to shorten the phase lock acquisition time by temporarily widening the loop bandwidth.

The function of switch 34 may be implemented as a microcontroller procedure as well, an implementation that results in the switch outputs being inherently capable of storing values sent to them. As a result, a device coupled with a particular output keeps receiving the stored value even after the switch has been moved into an alternate position and this particular output is no longer coupled to the switch input.

From the measured phase difference, PLL filter 32 produces a signal 35 representing a long-term average of the measured phase difference, which controls controlled-frequency oscillator 36. In the process of acquiring phase lock, the PLL brings the long-term average phase difference to a substantially constant value.

As was stated above, in a general case the synchronization reference signals may differ among themselves in phase and/or frequency. Since the phase-locked loop is required to always bring the long-term average reference-to-feedback phase difference to a constant value, selecting a new reference, even one with an identical frequency but a substantially different phase, results in a transition forcing controlled-frequency oscillator 36 to an undesired frequency, and causing a drift of the feedback signal with respect to the reference, until their relative phase is brought back to the constant value.

Figure 2:
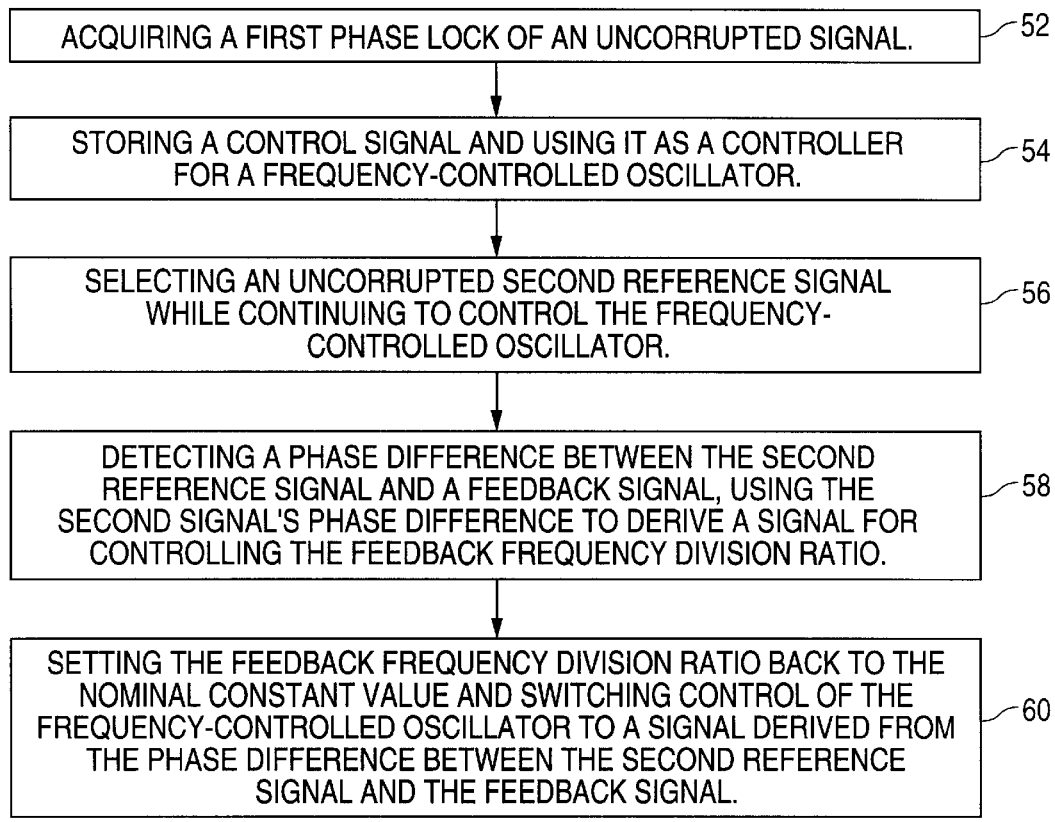
FIG. 2 illustrates a flow chart of a method of the present invention for eliminating a phase transient of an controlled -frequency oscillator.

Turning next to FIG. 2, there is provided a flow chart 50 illustrating a method for eliminating a phase transient of a controlled-frequency oscillator, the phase transient being caused by replacing the first reference signal 12 (that becomes corrupted or otherwise unavailable for network synchronization purposes) with a second reference signal 14 (that is suitable for network synchronization purposes). In a preferred embodiment, method 50 is performed by the network synchronization card 10 of FIG. 1.

While first reference signal 12, having a first reference phase and a first reference frequency, is still useful, the first phase lock is acquired (step 52 of FIG. 2) between the first reference signal 12 and feedback signal 39. The first reference signal 12 is used for an indefinite period of time, as long as it is suitable. Feedback signal 39, having a feedback phase and a feedback frequency, is generated by tunable frequency processing device 38, which is clocked by the clock signal generated by frequency controlled oscillator 36 and forwarded across line 44. Switch 34 is positioned such that the input controlling frequency division ratio of tunable frequency processing device 38 is disconnected from filter 32 and the frequency division ratio of tunable frequency processing device 38 is set to a constant, nominal value. Thus, dividing the frequency of the clock signal across line 44 by the constant, nominal frequency division ratio of tunable frequency processing device 38 derives the feedback frequency of the feedback signal 39. The first phase lock results in substantially constant first phase difference between the first reference phase and the feedback phase, and in substantially constant first value of a control signal 35 derived from the substantially constant first phase difference.

While the PLL continues using first reference signal 12 and maintains the first phase lock, each most recently obtained value of control signal 35 is applied to control controlled-frequency oscillator and it is also stored in digital form as a first stored value for later use in step 54.

After the first reference signal 12 becomes unavailable, the first stored value of control signal 35 is used to control controlled-frequency oscillator 36 (step 54). This results in oscillator 36 running at a constant frequency derived from the first stored value.

Then, in step 56, the second reference signal 14 having a second frequency and a second phase is selected, while controlled-frequency oscillator 36 is still under control of the first stored value and—as a result—is running at a constant frequency. At the same time, switch 34 is moved into the position in which the output of filter 32 is coupled with the control input of tunable frequency processing device 38.

The phase difference detector 30 of FIG. 1 detects the second phase difference between the second reference signal 14 and the feedback signal 39. From the second phase difference, filter 39 derives second control value 37 which, through switch 34 is applied to the input controlling frequency division ratio of tunable frequency processing device 38.

A second phase lock is acquired (step 58) by controlling the frequency division ratio of tunable frequency processing device 38, while controlled-frequency oscillator runs at a constant frequency.

After the second phase lock is acquired, Function Control block 24 discontinues control of the division ratio of tunable frequency processing device 38 and sets the feedback frequency division ratio back to its nominal constant value. The Function Control block 24 also moves switch 34 into its alternative position and thereby discontinues control of the controlled-frequency oscillator by the first stored value and establishes control by a signal derived from the second phase difference between the phase of the second reference signal 14 and the phase of the feedback signal 39.

This leads to acquiring a third phase lock between the feedback signal 39 and the second reference signal 14 by controlling the frequency of the controlled-frequency oscillator (step 60), wherein the third phase lock results in keeping the second phase difference between the second reference phase and the feedback phase substantially constant.

Switching from the first reference signal 12 to the second reference signal 14 according to the above-described sequence of steps 52 through 60 minimizes or completely eliminates transitional disturbance of phase and frequency of controlled-frequency oscillator 36.

In a preferred embodiment, the feedback frequency division ratio of tunable frequency processing device 38 is controlled in a manner resulting in the frequency of the feedback signal 39 being proportional to the output value 33 of PLL filter 32. In an alternative embodiment, FIG. 3 shows a first circuit 70 including a counter 74, a limit register 84, and a comparator 80, configured to implement the tunable frequency processing device 38 (of FIG. 1).

Figure 3:
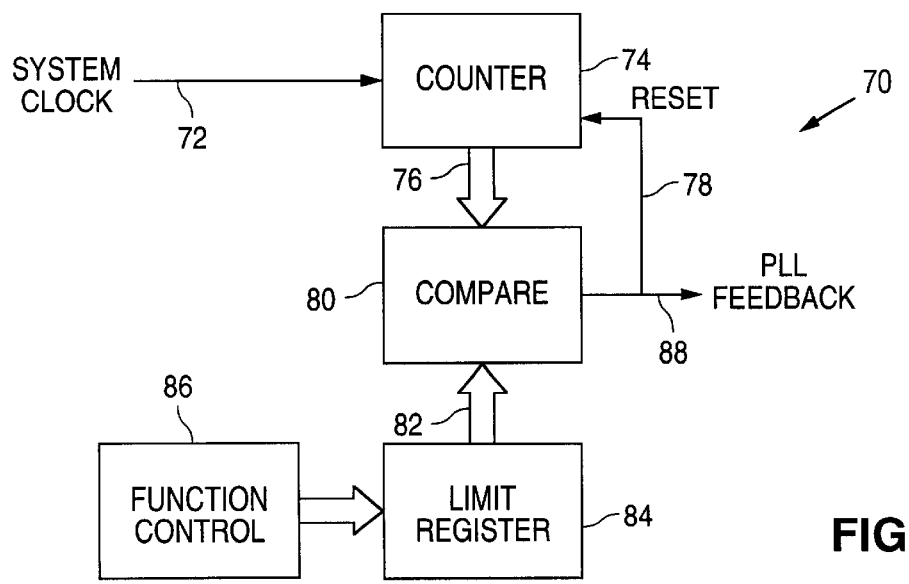
FIG. 3 shows a first implementation of the tunable frequency processing device of FIG. 1 including a counter, limit register, and a comparator.
Figure 4:
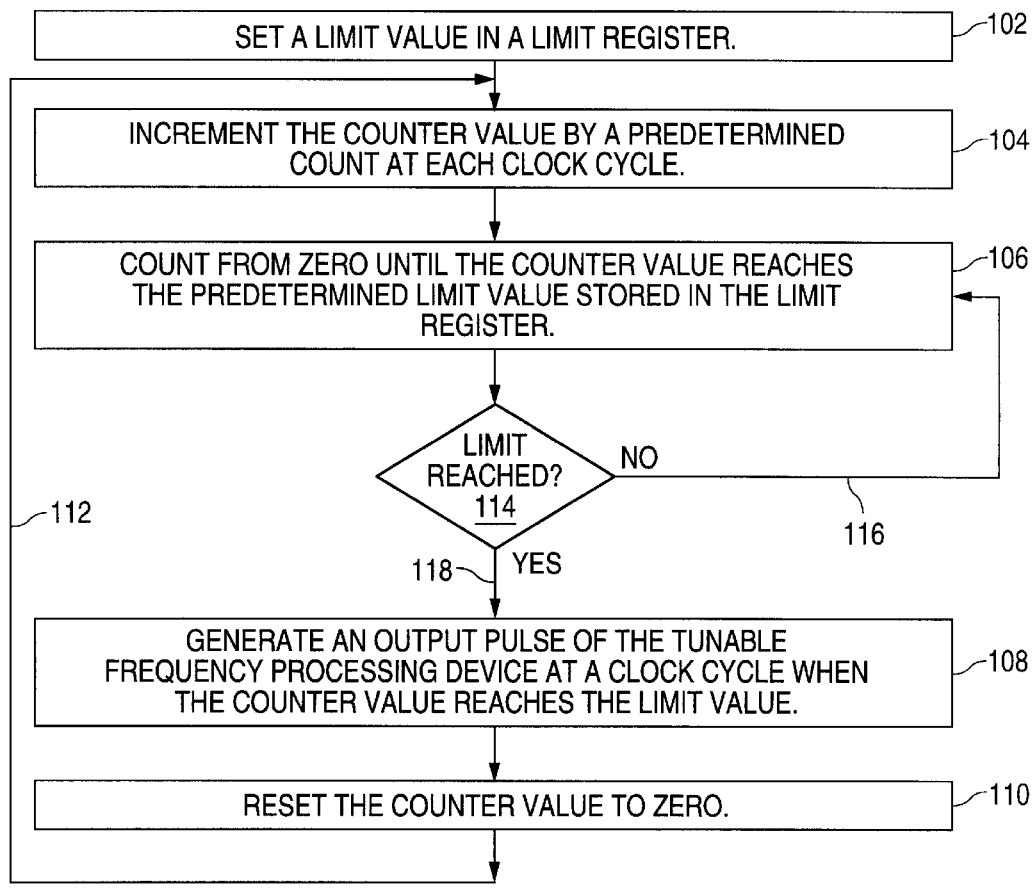
FIG. 4 illustrates the flow chart of the method for controlling the feedback frequency division ratio of the tunable frequency processing device of FIG. 1 using the circuitry of FIG. 3.

FIG. 4 provides a flowchart illustrating the steps performed by circuit 70 (of FIG. 3) in order to generate PLL feedback signal 88 (or 39 of FIG. 1) by dividing clock signal 72 (of FIG. 5) generated by controlled-frequency oscillator 36 (of FIG. 1) under control of Function Control block 24 (and 86 of FIG. 3).

The Function Control block 86 (of FIG. 3, or 24 of FIG. 1) sets a predetermined limit value (step 102 of FIG. 4) in limit register 84 (of FIG. 3), and a predetermined count by which the value of counter 74 (of FIG. 3) is incremented at each clock cycle (step 104 of FIG. 4). The predetermined count can comprise one count, two counts and so on. Counter 74 preferably comprises a 12-bit counter.

The counting continues from zero until the counter value reaches the predetermined limit value stored in the limit register. If the predetermined limit value is not reached, comparison block 114 (of FIG. 4) yields the logical value NO (114 of FIG. 4) and the counting continues (step 104 of FIG. 4). If, on the other hand, the predetermined limit value is reached, comparison block 114 (of FIG. 4) yields the logical value YES (118) of FIG. 4) then the counting stops, and the tunable frequency processing device generates an output pulse (step 108 of FIG. 4). The output pulse is used by the PLL to generate feedback signal 88 (of FIG. 3). After the feedback signal is generated, the counter value is reset to zero (step 110 of FIG. 4) as shown by a reset signal (78 of FIG. 3). Steps 104–110 are then preferably repeated.

The division ratio of tunable frequency processing device 38 (of FIG. 1) depends on the limit value stored in limit register 84 (of FIG. 3). By changing the limit value stored in limit register 84, the Function Control block controls the division ratio. In one embodiment, a non-integer long-term average value of the division ratio can be obtained if the Function Control block changes the limit value periodically and at a precisely controlled rate.

EXAMPLE I

Nominal Frequency Division Ratio

If the limit register is loaded with the nominal value of N−1, the frequency divider produces one cycle of PLL feedback signal every N cycles of the system clock. The resulting frequency division ratio is an integer: Kd=N.

EXAMPLE II

Non-integer Frequency Division Ratio

If for one out of every M PLL feedback cycles, the value in the limit register is changed to N−2, the resulting long-term average division ratio is a non-integer:

$$Kd=[(M-1)\times N+(N-1)]/M=N-(1/M).$$

Similarly, if for one out of every M PLL feedback cycles, the value in the limit register is changed to N−L, the resulting long-term average division ratio is also a non-integer:

$$Kd=[(M-1)\times N+(N-L)]/M=N-(L/M).$$

Referring to FIG. 3, when Function Control block 86 is operated by a microcontroller (not shown), such periodic change of the value in the limit register 84 can be easily implemented. Every time the counter is reset according to the changed value in the limit register, the phase of the feedback pulse is changed abruptly by the corresponding number of system clock cycles. This results in a step change of the phase error. The frequency rate at which these step changes of the phase error are made should stay above the bandwidth of the PLL in order for the PLL to be capable of smoothing the step changes of the phase error.

Figure 5:
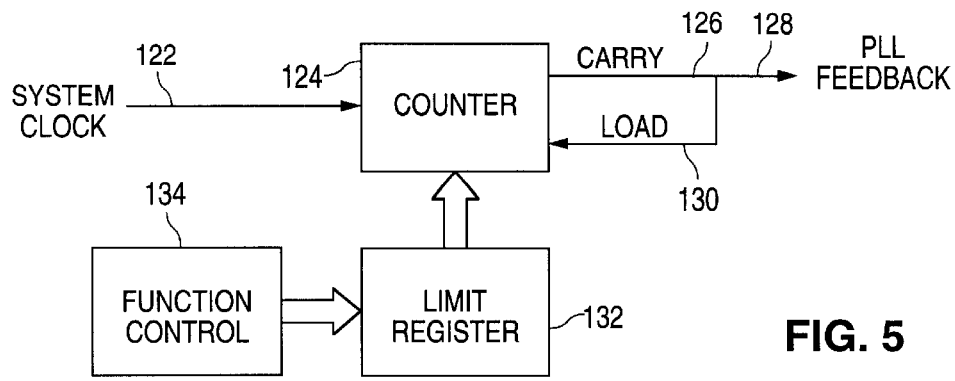
FIG. 5 depicts a second circuit including a counter comprising a plurality of flip-flops and a limit register configured to implement the tunable frequency processing device of FIG. 1.

In an alternative embodiment, FIG. 5 depicts a second circuit 120 including a counter 124, the counter including a plurality of flip-flops, and a limit register 132 configured to implement the tunable frequency processing device 38 (of FIG. 1).

Figure 6:
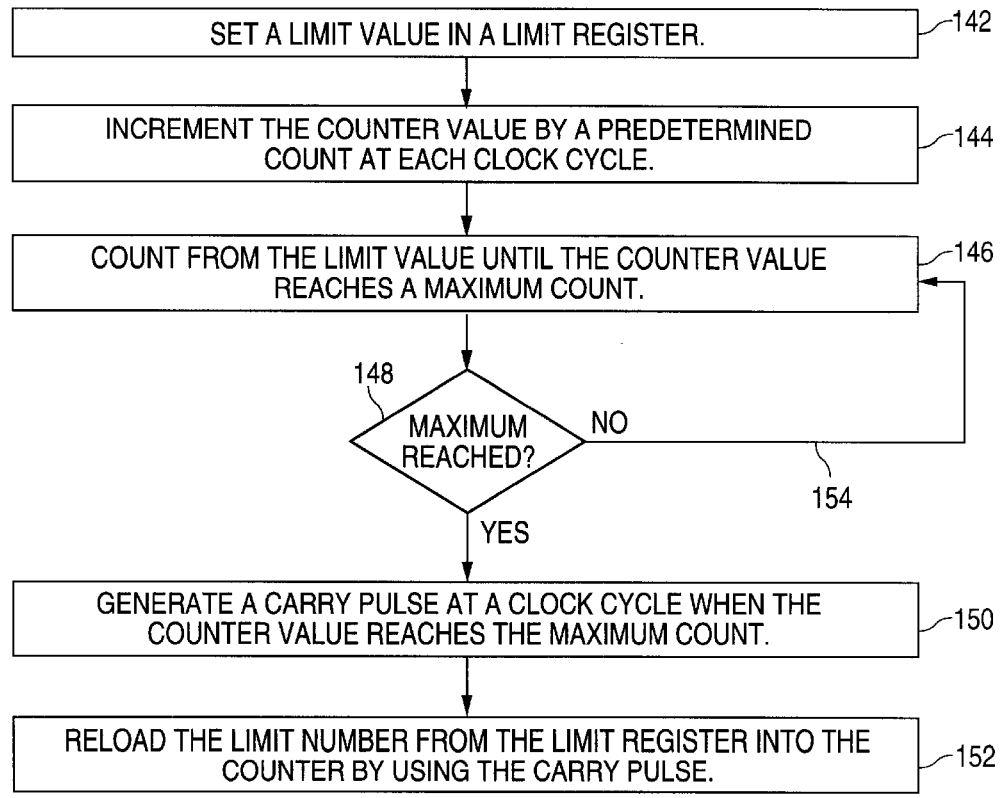
FIG. 6 is a flow chart illustrating steps performed by the circuitry of FIG. 5 to generate a feedback signal.

FIG. 6 depicts a flow chart describing the steps performed by circuit 120 (of FIG. 5) in order to generate PLL feedback signal 128 (or 39 of FIG. 1) by dividing clock signal 122 (of FIG. 5) generated by controlled-frequency oscillator 36 (of FIG. 1) under control of Function Control block 134 (of FIG. 5, or 24 of FIG. 1). After the Function Control block sets a predetermined limit value (step 142 of FIG. 6) in limit register 132 (of FIG. 5) and increments the counter value (step 144 of FIG. 6) by a predetermined count at each clock cycle, counting from the predetermined limit value continues until the counter value reaches a maximum count (comparison condition step 148). If the maximum count is not reached (logical arrow NO 154), steps 144 and 148 are repeated until it is reached.

When the maximum count is reached (logical arrow YES 156), a carry pulse is generated at step 150 at a clock cycle when the counter value reaches the maximum count. In one embodiment, the maximum count corresponds to each flip-flop being set to 1. In an embodiment wherein counter 124 comprises a 12-bit counter, the maximum count equals 4095. The carry pulse is used by PLL for generating feedback signal 39 (of FIG. 1). The carry pulse is also used for reloading the limit number from the limit register into the counter (step 152 of FIG. 6), which then repeats the counting cycle.

In device 120 (of FIG. 5) of tunable frequency processing device 38 (of FIG. 1), the division ratio is determined by the difference between the counter maximum count and the limit count. In an alternative embodiment, counter 124, decrements instead of incrementing, by a predetermined count at every system clock pulse. In this case, the counter counts down from the limit value towards zero instead of counting up from the limit towards a maximum count.

Device 120 also enables obtaining a non-integer, long-term average value of the division ratio by periodically changing the value in limit register 132 (of FIG. 5), at a precisely controlled rate, as described above.

Figure 7:
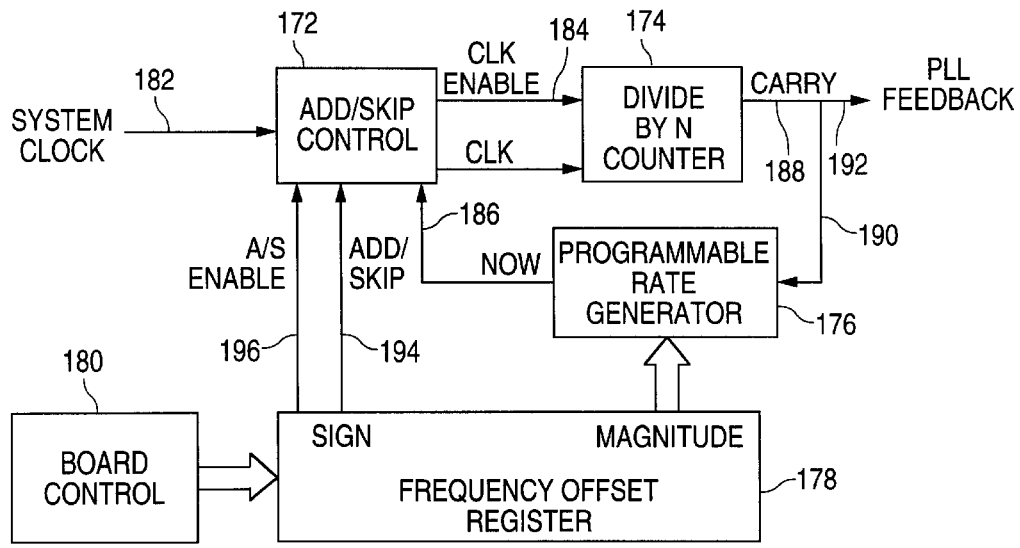
FIG. 7 depicts a third circuit including an add/skip control block, a divide-by-N counter, a programmable rate generator, and a frequency offset register configured to implement the tunable frequency processing device of FIG. 1.
Figure 8:
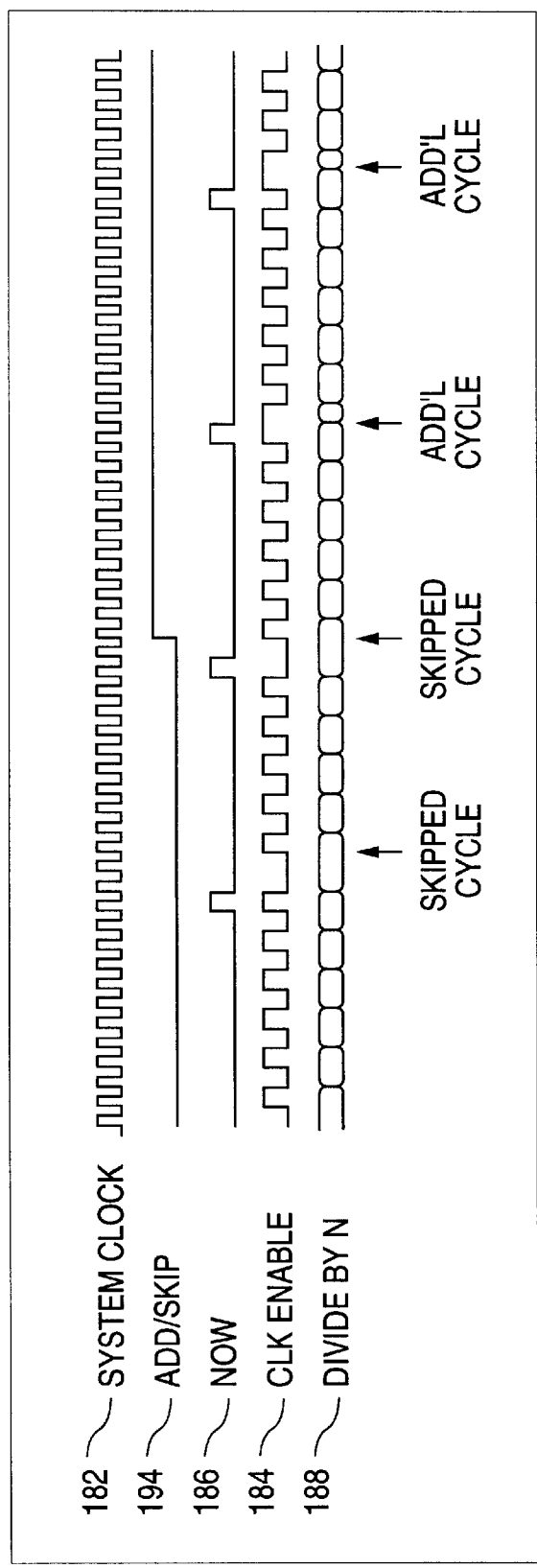
FIG. 8 illustrates a number of waveforms pertinent to understanding the functioning of the circuit of FIG. 7.

In one more alternative embodiment of the present invention, FIG. 7 illustrates a third circuit 170 including an add/skip control block 172, a divide-by-N counter 174, a programmable rate generator 176, and a frequency offset register 178. FIG. 8 illustrates a number of waveforms pertinent to understanding the functioning of circuit 170, including a system clock signal 182, an add/skip control signal 194, a NOW signal 186, a clock enable signal 184, and count transitions in divide-by-N counter 174 that generates a carry pulse signal (and PLL feedback signal) 188.

Figure 9:
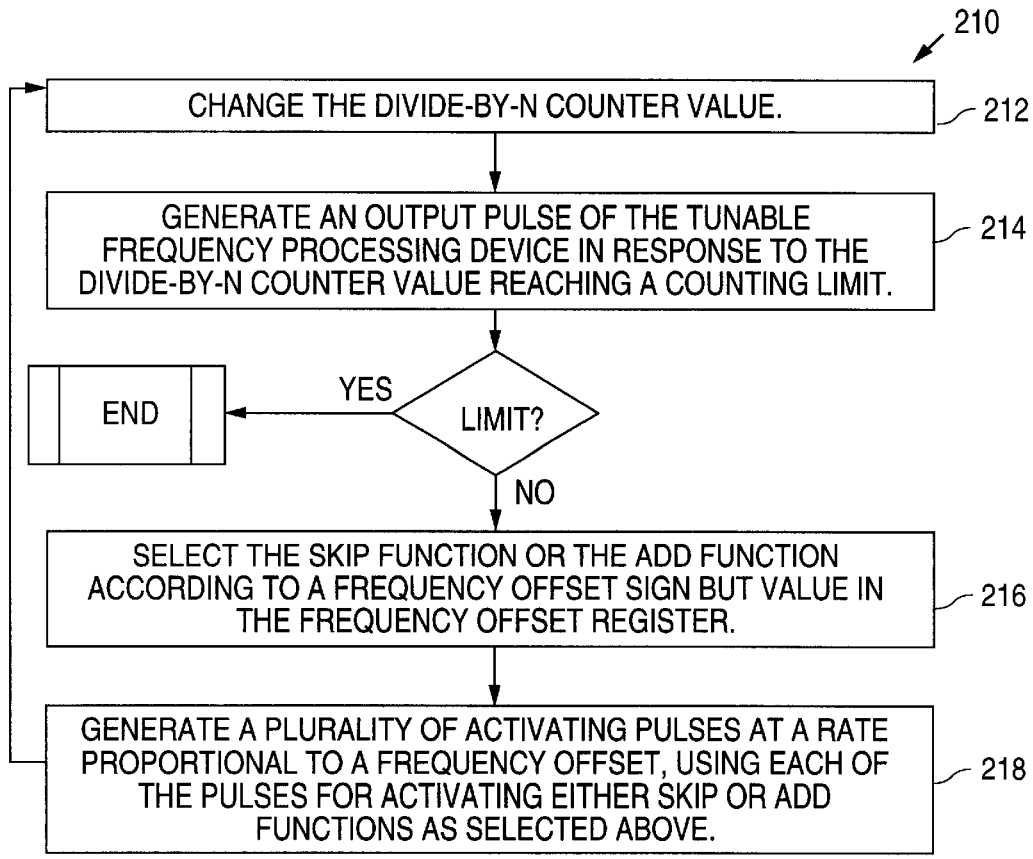
FIG. 9 is a flow chart of steps performed by the circuitry of FIG. 7 to generate a feedback signal.

FIG. 9 depicts a flow chart of steps performed by circuit 170 to generate a feedback signal 39 (or 188 of FIG. 8) by dividing clock signal 182 generated by the controlled-frequency oscillator 36 (of FIG. 1) under control of the add/skip signal (172 of FIG. 8) resulting in effectively changing its clock division ratio.

The divide-by-N counter (174), incrementing or decrementing by a predetermined count at each clock pulse 182 (FIG. 7), is configured to divide by a fixed ratio N, but is provided with a count skip/add control circuit 172.

In one embodiment of the present invention, the skip/add control circuit is configured to let the divide-by-N counter 174 skip changing its value once during a single clock cycle on each activation of the SKIP function by NOW pulse 186, or change its value one additional time (besides a normal increment or decrement) during a single clock cycle on each activation of the ADD function by NOW pulse 186.

In another embodiment of the present invention, the skip/add control circuit is configured to let the divide-by-N counter 174 skip changing its value or perform additional increments during a predetermined number of clock cycles on each activation of the SKIP/ADD function by the NOW pulse 186 (step 212 of FIG. 9).

As will be apparent to having the ordinary skill in the art to which the present invention pertains, the skip function may also be performed by making the divide-by-N counter 174 count in reverse by at least one count on a single clock cycle when the skip function is activated, and the add function may be performed by incrementing the counter additionally by a count greater than one on a single clock cycle when the add function is activated.

In a preferred embodiment of the present invention, the skip/add control circuit is configured to let the divide-by-N counter 174 skip changing its value once during two clock cycles on each activation of the skip function.

The instances at which the add/skip operation happens (step 218 of FIG. 9) are determined by pulses, called NOW 186 (of FIGS. 7 and 8), generated by a programmable rate generator 176 at a rate loaded into the frequency offset register 178 by the Function Control block 180. The frequency offset register 178 also receives a sign bit from the Function Control block 180, which determines selection of add or skip operation (step 216 of FIG. 9).

Another bit in frequency offset register 178 (FIG. 7) received from Function Control block 180 enables or disables the add/skip operation. By adding or skipping counts at a controlled rate, the phase of the feedback pulses 192 can be changed in the desired direction by a required amount, and with a very well-controlled speed.

In a preferred embodiment of the present invention, for design convenience the programmable rate generator 176 is clocked by the carry pulse 190 from the output of the divide-by-N counter, which also provides the phase-locked loop feedback pulse 192. They are both generated in response to the divide-by-N counter 174 (FIG. 7) value reaching a predetermined counting limit (step 214 of FIG. 9).

In yet another alternative embodiment of the present invention (not shown), the tunable frequency processing device (38 of FIG. 1) can be implemented in the form of a frequency synthesizer which, typically, itself is a phase-lock loop incorporating one or more frequency dividers. These dividers can be controlled in the manner described above to achieve a non-integer ratio between the synthesizer's input and output frequencies. The synthesizer can provide at least partial smoothing out of the step changes in the PLL feedback signal 39 (FIG. 1) caused by the sudden change of the frequency division ratio.

As stated above, from time to time all the external reference signals at once may be temporarily unsuitable for network synchronization purposes, but it may be desirable to continue running the controlled-frequency oscillator with the frequency and phase acquired before the large scale disturbance occurred, until a suitable reference signal becomes available again. In this case in the available art, only the inherent long-term stability of the controlled-frequency oscillator guarantees the continuation of the frequency and phase of the reference signal. The concurrent requirements of high long-term free-run frequency stability of the controlled-frequency oscillator and capability of the controlled-frequency oscillator to be tuned over a relatively wide frequency range are contradictory and hard to satisfy. Thus, oscillators that satisfy both requirements are expensive.

The present invention enables satisfaction of both requirements while using a relatively low cost controlled-frequency oscillator capable of tuning within the required frequency range, but characterized by an inherent low stability of frequency in the free-run mode, by, instead of letting it run free in the holdover mode, running it phase-locked to a relatively low-cost high-stability fixed-frequency local oscillator in a manner in which phase and frequency acquired by the controlled-frequency oscillator prior to entering the holdover mode would be preserved.

When all external references become unavailable, a network synchronization card, preferably, should continue providing system clocks at a frequency and phase that was acquired before. Such mode of operation of a network synchronization card is usually referred to as holdover mode.

A typical network synchronization card operating in holdover mode according to the prior art, stores the value of the signal controlling the controlled-frequency oscillator 36 at a previously acquired level, and applies it to the control input of the controlled-frequency oscillator 36, allowing it, essentially, to run free.

Figure 10:
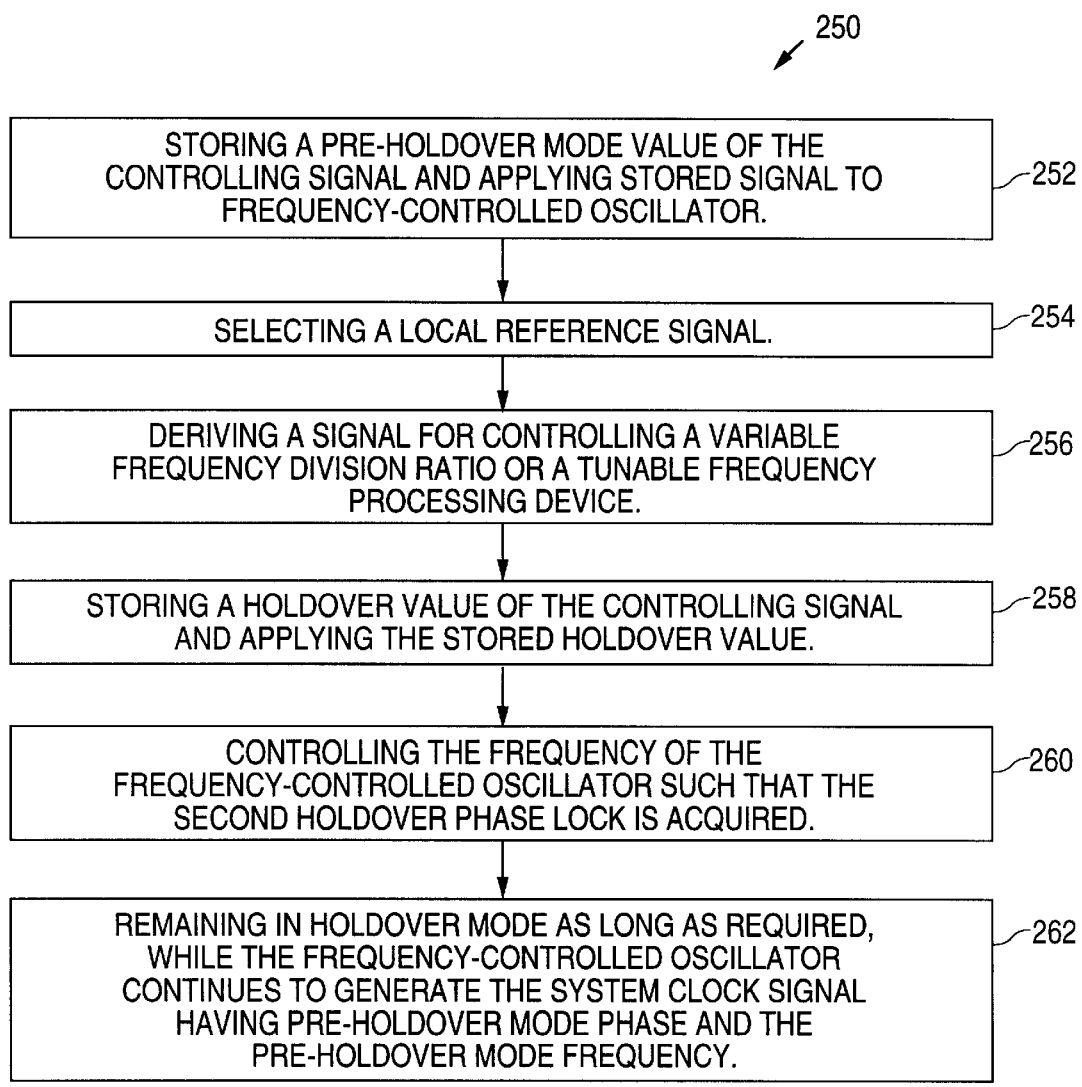
FIG. 10 is a flow chart of the steps performed by the circuitry of FIG. 1 in the holdover mode of operation.

FIG. 10 is a flow chart 250 illustrating steps performed by the network synchronization card 10 (FIG. 1) in order to support holdover mode of operation according to the present invention. A tunable feedback frequency processing device (38 of FIG. 1) is used for the purpose of eliminating phase transients, as well as for the purpose of acquiring phase-lock between the controlled-frequency oscillator 36 and the local reference oscillator 26 while preserving the phase and frequency the controlled-frequency oscillator 36 acquired prior to the holdover mode.

For the entire duration of the holdover mode, tunable feedback frequency processing device 38 operates with a precisely controlled, non-integer ratio between the frequencies of clock signal 44 generated by controlled-frequency oscillator 36 and feedback signal 39. In a preferred embodiment of the holdover mode of the present invention, tunable feedback frequency processing device 38 is implemented using device 170 (FIG. 7). Indeed, device 170 is preferably designed to add or skip one count during a single clock cycle each time the add/skip function is activated.

Adding or skipping counts by the divide-by-N counter results in the feedback signal jitter with amplitude equal to one period of clock signal 44 (FIG. 1) and, therefore, the rate of adding or skipping the clock pulses should be chosen to be always above the upper limit of the PLL bandwidth. In the preferred embodiment, feedback signal jitter (with average amplitude equal to +/−51.44 nanoseconds and the lowest rate close to 0.5 Hz) is easily eliminated by PLL filter 32 (FIG. 1).

With exception of a transitional interval, tunable feedback frequency processing device 38 is used to provide a constant, non-integer frequency ratio when controlled-frequency oscillator 36 is controlled by the PLL. The negative feedback action of the PLL leads to the loop reaching its stable state with the phase error substantially equal to zero and the controlled-frequency oscillator 36 kept at a substantially constant frequency that can be located anywhere within its tuning range and determined with high precision and resolution. In such a state, the long term stability of controlled-frequency oscillator 36 is determined by the stability of local reference oscillator 26, which, in a preferred embodiment is implemented using a low-cost, highly-stable, non-tunable quartz oscillator. This mode of operation of the PLL may be used to achieve high stability of the holdover mode over arbitrarily long time intervals in a network synchronization board using only a low-cost controlled-frequency oscillator. At the same time, the oscillator type can be freely chosen to provide a tuning range almost arbitrarily wide without compromising holdover stability.

Referring back to FIG. 10 and FIG. 1, at first (step 252 of FIG. 10, when the PLL is locked to the selected one of the external references 12 (of FIG. 1) or 14 and before both external references become unavailable, control signal 35 derived from the phase difference between feedback signal 39 and a selected external reference is applied to the controlled-frequency oscillator 36 and, simultaneously, it is also stored in digital form as a second stored value for later use in step 254.

When both external references become unavailable - a condition that requires going into holdover mode—the second stored value is applied to controlled-frequency oscillator 36 (step 254), resulting in the controlled-frequency oscillator running at a constant pre-holdover mode frequency and a pre-holdover mode phase.

In step 256, local reference signal 25, having a local reference frequency and a local reference phase, is selected as a PLL reference signal in the holdover mode, and phase difference detector 30 detects a holdover phase difference between the local reference signal 25 and a feedback signal 39 generated by a tunable frequency processing device 38 clocked by controlled-frequency oscillator 36.

The holdover phase difference is used (step 258 of FIG. 10) to derive control signal 37 which is applied to tunable frequency processing device 38 for controlling its frequency division ratio and, simultaneously, it is also stored in digital form as a third stored value for later use in step 260. This results in controlling frequency and phase of the feedback signal 39 in such a way that a first holdover phase lock of the feedback signal with the local reference signal 25 is acquired, while controlled-frequency oscillator 36 runs at a constant pre-holdover frequency and phase. In this step, in a way, the PLL "learns" the value of the feedback frequency division ratio resulting from the relationship between the phase and frequency of the controlled-frequency oscillator acquired prior to the holdover mode and phase and frequency of the local reference signal.

After the first holdover phase lock is acquired, the Function Control block 24 moves switch 34 in the alternate position. The third stored value is applied to tunable feedback frequency processing device 38 resulting in the device running with a constant, non-nominal frequency division ratio (step 260 of FIG. 10). The control signal 35 derived from holdover phase difference is applied to control frequency of the controlled-frequency oscillator 36 in such a way that a second holdover phase lock of the feedback signal with the local reference signal is acquired.

At this point in time, network synchronization card 10 has transitioned into the holdover mode, and can remain in the holdover mode for the required duration (it may be as long as 24 hours, or more, if necessary), while controlled-frequency oscillator 36 continues to generate the system clock signal having the pre-holdover mode phase and the pre-holdover mode frequency (step 260 of FIG. 10).

Another aspect of the present invention is directed to a method for switching a network synchronization card (10 of FIG. 1) from holdover mode of operation to normal mode of operation. In the preferred embodiment, this transition is handled in a way very similar to handling phase transients caused by switching from one external reference to another.

Figure 11:
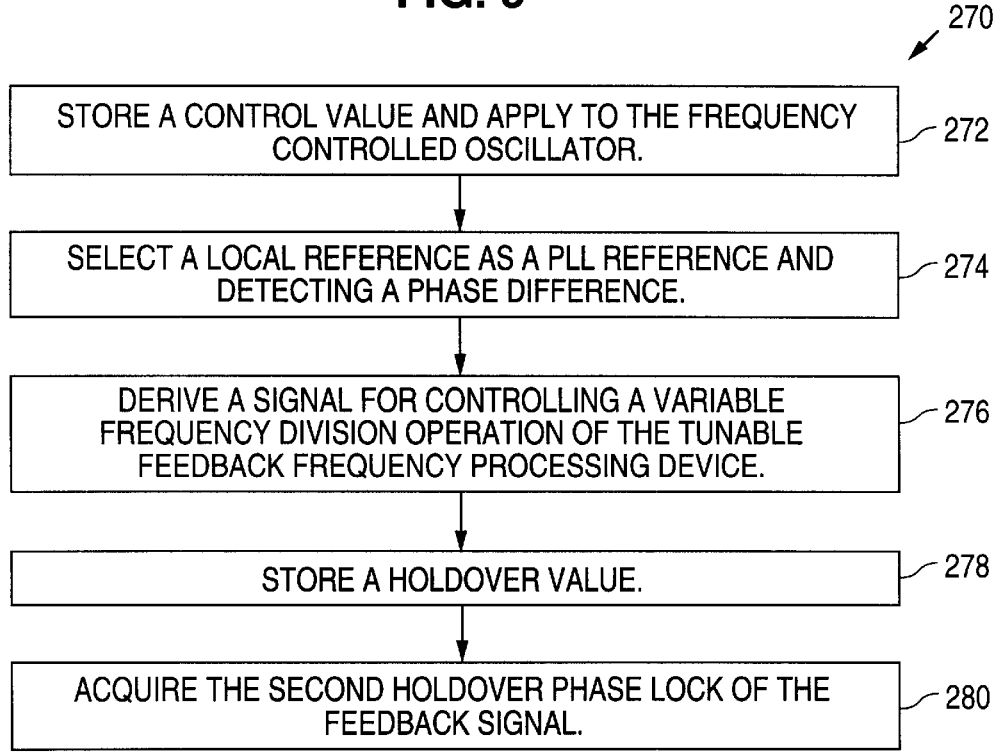
FIG. 11 illustrates a flow chart of a method of the present invention for switching a network synchronization card of FIG. 1 from a normal mode of operation to a holdover mode of operation.

Turning next to FIG. 11, there is provided a flow chart 270 illustrating a method for eliminating a phase transient of an controlled-frequency oscillator caused by transition from a holdover mode to a normal mode of operation, during which an external reference signal 12 or 14 (of FIG. 1), that became available again, is replacing the signal of local reference oscillator 26 that is no longer needed. In a preferred embodiment, method 270 is performed by the network synchronization card 10.

Before any suitable external reference becomes available again, the card operates in holdover mode, in which PLL 10 maintains phase lock between feedback signal 39 and processed local reference signal 25. The feedback signal is derived from output of controlled-frequency oscillator 36 by tunable frequency processing device 38 operating with a constant, non-nominal frequency division ratio acquired as a result of first holdover phase lock (step 256 of FIG. 10). This results in controlling frequency and phase of the controlled-frequency oscillator 36 in such a way that its frequency and phase remain substantially equal to the ones acquired prior to the transition into the holdover mode.

While the PLL continues using local reference signal 25 and maintains the second holdover phase lock, each most recently obtained value of control signal 35 is applied to control the controlled-frequency oscillator and it is also stored in digital form as a fourth stored value for later use in step 274.

After either first reference signal 12 or second reference signal 14 becomes available again, the fourth stored value is used to control the controlled-frequency oscillator 36 (step 274). This results in oscillator 36 running at a constant frequency derived from the fourth stored value.

Then, in step 276, the external reference signal that became available again is selected, while the controlled-frequency oscillator 36 is still under control of the fourth stored value and—as a result—is running at a constant frequency. At the same time, switch 34 is moved into the position in which the output of filter 32 is coupled with the control input of tunable frequency processing device 38.

The phase difference detector 30 detects a third phase difference between the selected reference signal 29 and the feedback signal 39. From the third phase difference, filter 32 derives control signal 35 which, through switch 34 is applied to the input controlling frequency division ratio of tunable frequency processing device 38.

A third phase lock is acquired (step 278) by controlling the frequency division ratio of tunable frequency processing device 38, while controlled-frequency oscillator 36 runs at a constant frequency.

After the third phase lock is acquired, Function Control block 24 discontinues control of the division ratio of tunable frequency processing device 38 and sets the feedback frequency division ratio back to its nominal constant value (step 260). The Function Control block 24 also moves switch 34 into its alternative position and thereby discontinues control of the controlled-frequency oscillator by the fourth stored value and establishes control by a signal derived from the third phase difference between the phase of the selected reference signal and the phase of the feedback signal 39.

This leads to acquiring a fourth phase lock between the feedback signal 39 and the selected reference signal by controlling the frequency of the controlled-frequency oscillator (step 280), wherein the fourth phase lock results in keeping the third phase difference between the selected reference phase and the feedback phase substantially constant.

Making the transition from holdover mode back to normal mode according to the above-described sequence of steps 272 through 280 substantiality eliminates transitional disturbance of phase and frequency of the controlled-frequency oscillator 36.

The description of the preferred and alternative embodiments of the present invention is given for purposes of explaining the principles thereof and enabling one skilled in the relevant art to make the invention, and is not to be considered as limiting or restricting the invention. Myriad modifications may be made through the exercise of ordinary skill in the relevant art without departing from the scope of the invention.

What is claimed is:

1. A method for eliminating a phase transient of a controlled-frequency oscillator utilizing a phase-locked loop (PLL), the method comprising the steps of:

(a) acquiring a first phase lock with a first reference signal having a first reference phase and a first reference frequency while using in the PLL a feedback signal having a feedback phase and a feedback frequency, the feedback signal being generated by a tunable frequency processing device operating with a constant, nominal frequency division ratio, the tunable frequency processing device being clocked by a clock signal generated by the controlled-frequency oscillator, the feedback frequency of the feedback signal being derived by dividing a frequency of the clock signal by the constant, nominal frequency division ratio of the tunable frequency processing device, the first phase lock resulting in a substantially constant first phase difference between the first reference phase and the feedback phase, and in a substantially constant first value of a control signal derived from the substantially constant first phase difference;

(b) storing the first value of the control signal and using the first stored control value as a signal controlling the frequency of the controlled-frequency oscillator, resulting in the controlled-frequency oscillator running at a constant frequency derived from the first stored value of the control signal;

(c) selecting a second reference signal having a second frequency and a second phase, while continuing the control of the Controlled-frequency oscillator with the first stored control value which results in the Controlled-frequency oscillator running at the constant frequency derived from the first stored control value;

(d) detecting a second phase difference between the second reference signal and the feedback signal; using the second phase difference to derive a signal for controlling the feedback frequency division ratio of the tunable frequency processing device, resulting in controlling the frequency and the phase of the feedback signal generated by the tunable frequency processing device in such a way that a second phase lock of the feedback signal with the second reference signal is acquired, wherein the frequency of the locked feedback signal is substantially equal to the frequency of the second reference signal, and the second phase difference is substantially equal to the first phase difference; and (e) setting the feedback frequency division ratio back to the nominal constant value; switching a frequency control of the controlled-frequency oscillator from the first stored control value to a signal derived from the second phase difference between the phase of the second reference signal and the phase of the feedback signal; and acquiring a third phase lock of the feedback signal to the second reference signal by controlling the frequency of the controlled-frequency oscillator, the third phase lock resulting in a substantially constant second phase difference between the second reference phase and the feedback phase.

2. The method of claim 1, the tunable frequency processing device further including a counter and a limit register, wherein the step (d) of using the second phase difference to derive the signal for controlling the feedback frequency division ratio of the tunable frequency processing device further includes the steps of:

(d1) setting a predetermined limit value in the limit register;

(d2) incrementing the counter value by a predetermined count at each clock cycle;

(d3) counting from zero until the counter value reaches the predetermined limit value stored in the limit register;

(d4) generating an output pulse of the tunable frequency processing device at a clock cycle when the counter value reaches the predetermined limit value; wherein the output pulse is used by the PLL for generating the feedback signal;

(d5) resetting the counter value to zero; and (d6) repeating the steps (d2)–(d5).

3. The method of claim 2, wherein the step (d1) of setting the predetermined limit value in the limit register further includes the step of controlling the division ratio by changing the predetermined limit value in the limit register, wherein the division ratio is determined by the predetermined limit value.

4. The method of claim 3, wherein the step of controlling the division ratio by changing the predetermined limit value in the limit register further includes the step of periodically changing the predetermined limit value at a precisely controlled rate in order to obtain a non-integer long-term average value of the division ratio.

5. The method of claim 1, the tunable frequency processing device further including a counter and a limit register, the counter including a plurality of flip-flops, wherein the step (d) of controlling the feedback frequency division ratio of the tunable frequency processing device further includes the steps of:

(d7) setting a predetermined limit value in the limit register;

(d8) incrementing the counter value by a predetermined count at each clock cycle;

(d9) counting from the predetermined limit value until the counter value reaches a maximum count, wherein the maximum count corresponds to each of the flip-flops being set to 1;

(d10) generating a carry pulse at a clock cycle when the counter value reaches the maximum count; wherein the carry pulse is used for generating the feedback signal;

(d11) reloading the limit number from the limit register into the counter by using the carry pulse; and (d12) repeating the steps (d8)–(d11).

6. The method of claim 5, wherein the step (d7) of setting the predetermined limit value in the limit register further includes the step of controlling the division ratio by changing the predetermined limit value in the limit register, wherein the division ratio is determined by the difference between the counter maximum count and the predetermined limit value.

7. The method of claim 6, wherein the step of controlling the division ratio by changing the predetermined limit value in the limit register further includes the step of periodically changing the predetermined limit value at a precisely controlled rate in order to obtain a non-integer long-term average value of the division ratio.

8. The method of claim 1, the tunable frequency processing device further including a divide-by-N counter configured to divide by a predetermined ratio, a frequency offset register, a programmable rate generator, and an add/skip control circuit; wherein the step (d) of controlling the feedback frequency division ratio of the tunable frequency processing device further includes the steps of:

(d13) changing the divide-by-N counter value by a first predetermined count at each clock cycle when neither the add function nor the skip function is selected and active; or by a second predetermined count at each clock cycle when the add function is selected and active, or by a third predetermined count at each clock cycle when the skip function is selected and active, the second predetermined count being greater than the first predetermined count, the third predetermined count being lesser than the first predetermined count;

(d14) generating an output pulse of the tunable frequency processing device in response to the divide-by-N counter value reaching a predetermined counting limit; wherein the output pulse is used for generating the feedback signal;

(d15) selecting the skip function or the add function according to a frequency offset sign bit value in the frequency offset register;

(d16) generating a plurality of activating pulses by the programmable rate generator, at a rate proportional to a frequency offset magnitude value in the frequency offset register and using each of the activating pulses for activating either the skip function or the add function, according to the selection made in step d15; and (d17) repeating the steps (d13–d16).

9. The method of claim 8, wherein the step (d16) of generating the plurality of activating pulses by the programmable rate generator further includes the step of clocking the programmable rate generator by using an output pulse of the tunable frequency processing device.

10. The method of claim 8, wherein the step (d16) of activating the selected skip function further includes the step of allowing the divide-by-N counter to skip changing its value on a predetermined number of clock cycles when the skip function is activated.

11. The method of claim 8, wherein the step (d16) of activating the selected skip function further includes the step of allowing the divide-by-N counter to count in reverse by at least one count on each clock cycle when the skip function is activated.

12. The method of claim 8, wherein the step (d16) of activating the selected add function further includes the step of activating the selected add function, wherein the divide-by-N counter changes its value by at least two counts on each clock cycle during which the add function is activated.

13. The method of claim 10, further including the step of allowing the divide-by-N counter to change its value by at least two counts on each clock cycle during which the add function is activated.

14. The method of claim 8, wherein the step (d14) of generating the carry output pulse of the frequency processing device further includes the step of changing a phase of the feedback signal generated by the carry output pulse by adding or skipping at least one count at a controlled skip or add rate.

15. A method for running a controlled-frequency oscillator in a frequency-controlled holdover mode comprising the steps of:

(a) storing a pre-holdover mode value of the signal controlling the controlled-frequency oscillator, and applying the stored pre-holdover value to the controlled-frequency oscillator, resulting in the controlled-frequency oscillator running at a constant pre-holdover mode frequency and a pre-holdover mode phase derived from the stored pre-holdover value of the control signal;

(b) selecting a local reference signal, having a local reference frequency and a local reference phase, as a PLL reference in holdover mode; detecting a holdover phase difference between the local reference signal and a feedback signal generated by a tunable frequency processing device; the tunable feedback frequency processing device being clocked by the controlled-frequency oscillator;

(c) using the holdover phase difference to derive a signal for controlling a variable frequency division ratio of the tunable feedback frequency processing device, resulting in controlling a frequency and a phase of the feedback signal in such a way that a first holdover phase lock of the feedback signal with the local reference signal is acquired, wherein the frequency and the phase of the locked feedback signal are substantially equal to the frequency and the phase of the local reference signal;

(d) storing a holdover value of the signal controlling the tunable feedback frequency processing device, the holdover value of the controlling signal obtained as a result of the first holdover phase lock acquired in step (c), and applying the stored holdover value to the tunable feedback frequency processing device, resulting in the tunable feedback frequency processing device running with a constant, non-nominal frequency division ratio;

(e) using the holdover phase difference to control frequency of the controlled-frequency oscillator in such a way that a second holdover phase lock of the feedback signal with the local reference signal is acquired; and (f) continuing in the second holdover phase lock state acquired in the step (e) for the required duration of the holdover mode, wherein the controlled-frequency oscillator continues to generate the system clock signal having the pre-holdover mode phase and the pre-holdover mode frequency.

16. A method for switching a network synchronization card from a normal mode of operation to a holdover mode of operation using a phase-locked loop (PLL), the method comprising the steps of:

(a) storing a control value of a signal controlling an controlled-frequency oscillator at the level acquired as a result of phase lock during the normal mode of operation of the network synchronization card; applying the stored control value to the controlled-frequency oscillator, resulting in the controlled-frequency oscillator running at a constant normal mode frequency and a constant normal mode phase derived from the stored normal value of the control signal;

(b) selecting a local reference signal, having a local reference frequency and a local reference phase, as a PLL reference in holdover mode; detecting a holdover phase difference between the local reference signal and a feedback signal generated by a tunable frequency processing device; the tunable feedback frequency processing device being clocked by the controlled-frequency oscillator;

(c) using the holdover phase difference to derive a signal for controlling a variable frequency division ratio of the tunable feedback frequency processing device, resulting in controlling a frequency and a phase of the feedback signal in such a way that a first holdover phase lock of the feedback signal with the local reference signal is acquired, wherein the frequency and the phase of the locked feedback signal are substantially equal to the frequency and the phase of the local reference signal;

(d) storing a holdover value of the signal controlling the tunable feedback frequency processing device, the holdover value of the controlling signal obtained as a result of the first holdover phase lock acquired in step (c), and applying the stored holdover value to the tunable feedback frequency processing device, resulting in the tunable feedback frequency processing device running with a constant, non-nominal frequency division ratio; and (e) using the holdover phase difference to control frequency of the controlled-frequency oscillator in such a way that a second holdover phase lock of the feedback signal with the local reference signal is acquired.

17. A system for eliminating a phase transient of an controlled-frequency oscillator utilizing a phase-locked loop (PLL) comprising:

(a) means for acquiring a first phase lock with a first reference signal having a first reference phase and a first reference frequency while using in the PLL a feedback signal having a feedback phase and a feedback frequency, the first phase lock resulting in a substantially constant first phase difference between the first reference phase and the feedback phase, and in a substantially constant first value of a control signal derived from the substantially constant first phase difference;

(b) means for storing the first value of the control signal and using the stored first control value as a signal controlling the frequency of the controlled-frequency oscillator, resulting in the controlled-frequency oscillator running at a constant frequency derived from the first stored value of the control signal;

(c) a tunable frequency processing device operating with a controllable frequency division ratio, the tunable frequency processing device being clocked by a clock signal generated by the controlled-frequency oscillator, the tunable frequency processing device configured to generate the feedback signal, the feedback frequency of the feedback signal being derived by dividing a frequency of the clock signal by a constant nominal division ratio of the tunable frequency processing device;

(d) means for selecting a second reference signal having a second reference frequency and a second reference phase, while continuing the control of the controlled-frequency oscillator with the stored first control value which results in the controlled-frequency oscillator running at the constant frequency derived from the first stored control value;

(e) means for detecting a second phase difference between the second reference signal and the feedback signal;

using the second phase difference to derive a signal for controlling the controllable feedback frequency division ratio of the tunable frequency processing device, resulting in controlling the frequency and the phase of the feedback signal generated by the tunable frequency processing device in such a way that a second phase lock of the feedback signal with the second reference signal is acquired, wherein the frequency and the phase of the locked feedback signal are substantially equal to the frequency and the phase of the second reference signal;

(f) means for setting the feedback frequency division ratio back to the nominal constant value; and (g) means for switching a frequency control of the controlled-frequency oscillator from the first stored control value to a signal derived from the second phase difference between the phase of the second reference signal and the phase of the feedback signal, the second phase difference being substantially equal to the first phase difference, wherein a third phase lock of the feedback signal to the second reference signal is acquired by controlling the frequency of the controlled-frequency oscillator.

18. The system of claim 17, wherein the tunable frequency processing device further comprises:

a counter; and a limit register;

wherein the tunable frequency processing device generates a PLL feedback pulse at a clock cycle when the counter value reaches a predetermined limit value set in the limit register.

19. The system of claim 18 further including means for changing the predetermined limit value in the limit register at a controlled rate in order to obtain a non-integer long-term average value of the division ratio.

20. The system of claim 18, wherein the counter further includes a plurality of flip-flops, wherein a carry pulse is generated at a clock cycle when the counter value reaches a maximum count corresponding to each of the flip-flops being set to 1.

21. The system of claim 17, wherein the tunable frequency processing device further comprises:

a divide-by-N counter configured to divide by a predetermined ratio;

a frequency offset register;

a programmable rate generator; and an add/skip control circuit;

wherein a frequency of an output pulse is determined by the value of the signal controlling the feedback frequency division ratio, the signal being loaded in the frequency offset register.

22. The system of claim 17, wherein the tunable frequency processing device further comprises:

a means for generating a feedback signal; and a means for obtaining a non-integer long-term average value of the frequency division ratio.

* * * * *